(12) United States Patent
Chandrika Reghunathan et al.

(10) Patent No.: US 12,328,891 B2
(45) Date of Patent: Jun. 10, 2025

(54) SILICON-ON-INSULATOR (SOI) DEVICE HAVING VARIABLE THICKNESS DEVICE LAYER AND CORRESPONDING METHOD OF PRODUCTION

(71) Applicant: Infineon Technologies Austria AG, Villach (AT)

(72) Inventors: Manoj Chandrika Reghunathan, Kulim (MY); Devesh Kumar Datta, Butterworth Penang (MY); Eric Alois Graetz, Penang (MY); Muhammad Akmal Hasanudin, Selangor (MY); Vijay Anand Ramadass, Penang (MY)

(73) Assignee: Infineon Technologies Austria AG, Villach (AT)

( * ) Notice: Subject to any disclaimer, the term of this patent is extended or adjusted under 35 U.S.C. 154(b) by 305 days.

(21) Appl. No.: 17/898,836

(22) Filed: Aug. 30, 2022

(65) Prior Publication Data

US 2024/0072159 A1 Feb. 29, 2024

(51) Int. Cl.
*H10D 30/01* (2025.01)
*H01L 21/02* (2006.01)
(Continued)

(52) U.S. Cl.
CPC ..... *H10D 30/051* (2025.01); *H01L 21/02532* (2013.01); *H01L 21/02642* (2013.01); *H10D 30/0281* (2025.01); *H10D 30/657* (2025.01); *H10D 30/80* (2025.01); *H10D 62/111* (2025.01); *H10D 62/115* (2025.01); *H10D 62/126* (2025.01); *H10D 62/149* (2025.01);
(Continued)

(58) Field of Classification Search
CPC ............ H01L 21/8234; H10D 62/052; H10D 30/657; H10D 30/0281; H10D 30/0287; H10D 62/154; H10D 62/158
See application file for complete search history.

(56) References Cited

U.S. PATENT DOCUMENTS 4,966,861 A * 10/1990 Mieno ............... H01L 21/02576
438/300
7,001,804 B2 2/2006 Dietz et al.
(Continued)

FOREIGN PATENT DOCUMENTS

WO 2017062090 A1 4/2017

*Primary Examiner* — Raj R Gupta
(74) *Attorney, Agent, or Firm* — Murphy, Bilak & Homiller, PLLC (57) ABSTRACT

A method of producing power semiconductor devices from a silicon-on-insulator (SOI) wafer is described. The SOI wafer includes a silicon device layer, a bulk silicon wafer, and a buried oxide layer separating the silicon device layer from the bulk silicon wafer. The method includes: forming a hard mask on the silicon device layer, wherein the hard mask covers one or more first regions of the silicon device layer and exposes one or more second regions of the silicon device layer; and before forming any field oxide structures and before implanting any device regions, selectively growing epitaxial silicon on the one or more second regions of the silicon device layer exposed by the hard mask such that the thickness of the one or more second regions is increased relative to the one or more first regions. Various devices produced according to the method are also described.

14 Claims, 7 Drawing Sheets

(51) Int. Cl.
    *H10D 30/65*     (2025.01)
    *H10D 30/80*     (2025.01)
    *H10D 62/10*     (2025.01)
    *H10D 62/13*     (2025.01)
    *H10D 87/00*     (2025.01)

(52) U.S. Cl.
    CPC ......... *H10D 62/154* (2025.01); *H10D 62/158* (2025.01); *H10D 87/00* (2025.01)

(56) References Cited

U.S. PATENT DOCUMENTS

| | | | |
|---|---|---|---|
| 7,105,399 B1 | 9/2006 | Dakshina-Murthy et al. | |
| 7,141,459 B2 | 11/2006 | Yang et al. | |
| 7,253,068 B1 | 8/2007 | Ju et al. | |
| 8,460,976 B2 * | 6/2013 | Cheng | H10D 64/516 438/335 |
| 10,559,593 B1 * | 2/2020 | Metze | H01L 27/1203 |
| 2004/0232489 A1 | 11/2004 | Barna | |
| 2011/0042729 A1 | 2/2011 | Chen et al. | |
| 2016/0197111 A1 | 7/2016 | Coolbaugh et al. | |

\* cited by examiner

SILICON-ON-INSULATOR (SOI) DEVICE HAVING VARIABLE THICKNESS DEVICE LAYER AND CORRESPONDING METHOD OF PRODUCTION

BACKGROUND

Silicon-on-insulator (SOI) technology involves the fabrication of silicon semiconductor devices in a layered silicon-insulator-silicon substrate. Achieving very high breakdown voltage (e.g., >600V) using a lateral SOI complementary metal-oxide-semiconductor (CMOS) process requires a well-controlled, thin top Si (silicon) device layer thickness. However, such a very thin Si device layer thickness in SOI technology has disadvantages such as high series resistance for high voltage devices (e.g., >600V) with very long drift lengths. Additionally, the performance of low voltage devices (e.g., <600V) formed in the same Si device layer as high voltage devices may not be acceptable for low-voltage logic circuits.

Thus, there is a need for an improved SOI process that can accommodate both high-voltage devices and low-voltage devices in the same Si device layer.

SUMMARY

According to an embodiment of a method of producing power semiconductor devices from a silicon-on-insulator (SOI) wafer that includes a silicon device layer, a bulk silicon wafer, and a buried oxide layer separating the silicon device layer from the bulk silicon wafer, the method comprises: forming a hard mask on the silicon device layer, wherein the hard mask covers one or more first regions of the silicon device layer and exposes one or more second regions of the silicon device layer; and before forming any field oxide structures and before implanting any device regions, selectively growing epitaxial silicon on the one or more second regions of the silicon device layer exposed by the hard mask such that the thickness of the one or more second regions is increased relative to the one or more first regions.

According to an embodiment of a semiconductor die, the semiconductor die comprises: a silicon-on-insulator (SOI) substrate that includes a silicon device layer, a bulk silicon substrate, and a buried oxide layer separating the silicon device layer from the bulk silicon substrate; a lateral power MOSFET (metal-oxide-semiconductor field-effect transistor) formed in a first device region of the silicon device layer; and an additional semiconductor device formed in a second device region of the silicon device layer and having a lower breakdown voltage than the lateral power MOSFET, wherein the silicon device layer has a first thickness in a first part of the first device region and a second thickness in a second part of the first device region, the second thickness being greater than the first thickness, wherein the silicon device layer has the first thickness throughout the second device region.

According to an embodiment of a semiconductor die, the semiconductor die comprises: a silicon-on-insulator (SOI) substrate that includes a silicon device layer, a bulk silicon substrate, and a buried oxide layer separating the silicon device layer from the bulk silicon substrate; and a lateral JFET (junction field-effect transistor) formed in the silicon device layer, wherein a first part of the silicon device layer has a first thickness and a second part of the silicon device layer has a second thickness greater than the first thickness, wherein, in the silicon device layer, the lateral JFET comprises a source region, a drain region, a drift zone adjoining the drain region, and a body region separating the source region from the drift zone, wherein the drift zone is formed in the second part of the silicon device layer.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide an SOI (silicon-on-insulator) process that can accommodate both high breakdown voltage devices (e.g., >600V) and low breakdown voltage devices (e.g., <600V) in the same Si device layer. The SOI process involves fabricating devices in a Si device layer with at least two different thicknesses. For example, an SOI base wafer may be provided and a hard mask such as an LPCVD (low-pressure chemical vapor deposition) oxide-based hard mask may be used to define an area where a thicker Si region is desired. The unmasked area may correspond to, e.g., the drift zone of a lateral power semiconductor device. The thickness of the Si device layer is increased in the unmasked area by selective Si epitaxial growth which is performed before forming any field oxide structures and before implanting any device regions in the Si device layer. Accordingly, existing front-end processes such as field oxide (FOX) isolation, contact etching, etc., may be used without modification.

Described next with reference to the figures are embodiments of the SOI process and devices produced using the SOI process.

FIGS. 1A through 1D illustrate cross-sectional views of part of an SOI wafer 100 during different stages of the SOI process. The SOI wafer 100 includes a silicon device layer 102, a bulk silicon wafer 104, and a buried oxide layer 106 separating the silicon device layer 102 from the bulk silicon wafer 104. In an embodiment, the silicon device layer 102 initially has a single thickness T_Si_init in a range of 100 to 200 nm (nanometers).

The SOI wafer 100 may be produced by SIMOX (separation by implantation of oxygen), wafer bonding, a seed method where the silicon device layer 102 is grown directly on the oxide layer 106, etc. The part of the SOI wafer 100 shown in FIGS. 1A through 1D corresponds to a high breakdown voltage (e.g., >600V) device region of a semiconductor die to be produced from the SOI wafer 100. For example, the high breakdown voltage device region may include a power semiconductor device such as a lateral power MOSFET (metal-oxide-semiconductor field-effect transistor), a lateral JFET (junction field-effect transistor), a PMOS device having a breakdown voltage greater than 600V, a power diode, etc. The SOI wafer 100 may yield tens, hundreds, or more semiconductor dies of the same design. The semiconductor dies may also include a low breakdown voltage (e.g., <600V) device region where the thickness of the silicon device layer 102 is not increased by the SOI process.

Figure 1A:
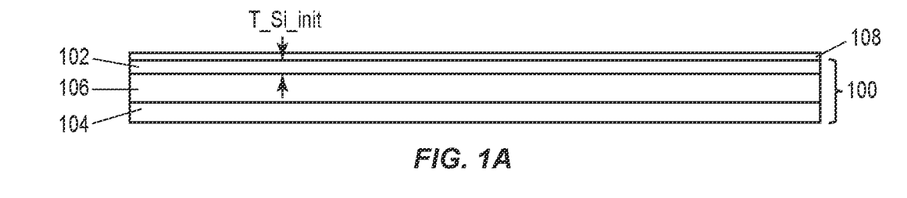
FIGS. 1A through 1D illustrate cross-sectional views of part of an SOI wafer during different stages of an SOI process, according to an embodiment.

FIG. 1A shows the SOI wafer 100 after a hard mask 108 is formed on the silicon device layer 108. In an embodiment, the hard mask 108 comprises tetraethoxysilane (TEOS) formed by low-pressure chemical vapor deposition (LPCVD).

Figure 1B:
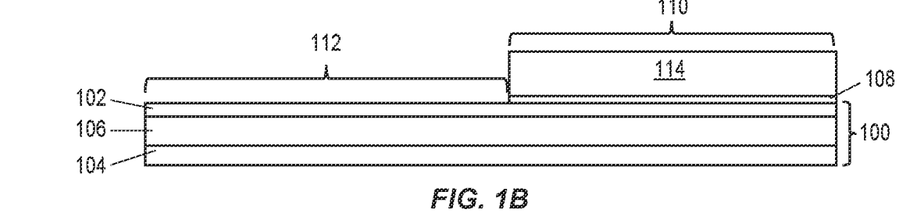

FIG. 1B shows the SOI wafer 100 after patterning of the hard mask 108. The hard mask 108, after patterning, covers one or more first regions 110 of the silicon device layer 102 and exposes one or more second regions 112 of the silicon device layer 102. In FIGS. 1A through 1D, the one or more first regions 110 of the silicon device layer 102 covered by the hard mask 108 correspond to contact regions of power semiconductor devices to be formed in the silicon device layer 102. Some first regions 110 may correspond to field oxide regions of the power semiconductor devices and/or additional semiconductor devices having a lower breakdown voltage than the power semiconductor devices to be formed in the silicon device layer 102. Various embodiments of the one or more first regions 110 of the silicon device layer 102 covered by the hard mask 108 are described in more detail later herein.

In an embodiment, the hard mask 108 is patterned by forming a patterned photoresist 114 on the one or more first regions 110 of the silicon device layer 102 and removing the exposed part of the hard mask 108 from the one or more second regions 112 of the silicon device layer 102. The exposed part of the hard mask 108 may be removed by etching, for example.

In FIGS. 1A through 1D, the one or more second regions 112 of the silicon device layer 102 exposed by the hard mask 108 correspond to drift zones of lateral power semiconductor devices to be formed in the silicon device layer 102. Various embodiments of the one or more second regions 112 of the silicon device layer 102 exposed by the hard mask 108 are described in more detail later herein.

Figure 1C:
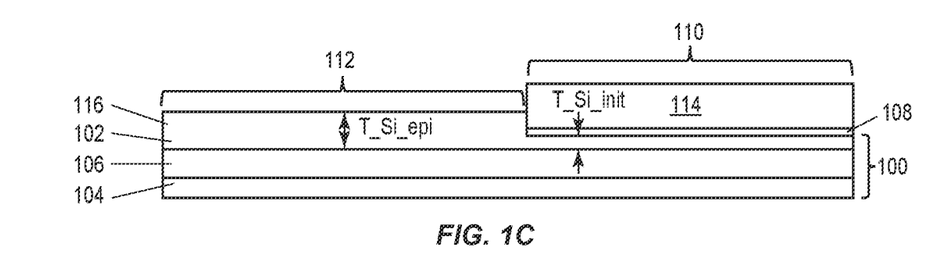

FIG. 1C shows the SOI wafer 100 after epitaxial silicon 116 is selectively grown on the one or more second regions 112 of the silicon device layer 102 exposed by the hard mask 108 such that the thickness T_Si_epi of the one or more second regions 112 is increased relative to the initial thickness T_Si_init of the silicon device layer 102. Accordingly, the one or more first regions 110 of the silicon device layer 102 protected by the hard mask 108 during the selective epitaxial growth process are thinner than the one or more second regions 112 of the silicon device layer 102 which are subjected to the selective epitaxial growth process. The selective growth of the epitaxial silicon 116 is performed before forming any field oxide structures and before implanting any device regions in the silicon device layer 102. In an embodiment, the selective growth of the epitaxial silicon 116 is performed by reduced pressure chemical vapour deposition (RPCVD) of silicon epitaxy.

The increased thickness T_Si_epi of the one or more second regions 112 of the silicon device layer 102 enables a lower Rdson (on-state resistance) for high breakdown voltage (e.g., >600V) lateral power semiconductor devices to be produced from the SOI wafer 100. The Rdson of such devices is dominated by the thickness of the silicon device layer 102 because of the (lateral) drift zone length (e.g., 30 to 100 nm). Increasing the thickness of the silicon device layer 102 in one or more unmasked regions 112 of the SOI wafer 100 enables Rdson reduction for lateral power semiconductor devices.

Other techniques for reducing Rdson of a lateral power semiconductor device are not as advantageous for thin SOI wafers. For example, RESURF doping optimization is limited because of the thin (e.g., 100 to 200 nm) silicon device layer 102. Also, there is no need to redesign pre-existing front end processes such as structure topology, implants, etc. Thermal budgets also are not affected, since the epitaxy process shown in FIG. 1C is performed early in the process before forming any field oxide structures and before implanting any device regions in the silicon device layer 102. This allows for the device design process to be simplified by simple layout engineering. Since the hard mask 108 may be patterned as desired, multiple device options with and without increased Si epitaxy thickness may be accommodated by patterning the hard mask 108 in a corresponding manner such that only those region(s) 112 of the silicon device layer 102 that benefit from increased epitaxy thickness are exposed during the selective epitaxial growth process.

One or more regions 110 of the SOI wafer 100 that do not stand to benefit from an increased Si epitaxy thickness are protected from the Si epitaxial growth process by the patterned hard mask 108. As explained above, the one or more masked regions 110 of the silicon device layer 102 may correspond to contact regions and/or field oxide regions of the lateral power semiconductor devices to be produced from the SOI wafer 100, and/or to additional semiconductor devices having a lower breakdown voltage than the lateral power semiconductor devices and to be formed in the silicon device layer 102. Accordingly, high breakdown voltage (e.g., >600V) lateral power semiconductor devices and low breakdown voltage (e.g., <600V) devices may be monolithically integrated using the same SOI wafer 100 without having to modify existing front-end processes such as field oxide isolation, contact etching, etc.

Figure 1D:
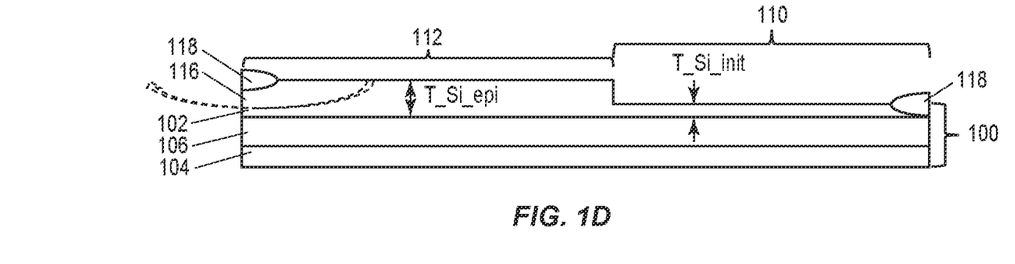

FIG. 1D shows the SOI wafer 100 after forming field oxide regions 118 which provide intra and/or inter device isolation. In an embodiment, the field oxide regions 118 may be STI (shallow trench isolation) or LOCOS (local oxidation of silicon) structures. For example, the field oxide regions 118 may be formed by growing afield oxide over targeted region(s) of the SOI wafer 100. If a field oxide region 118 is formed in any of the one or more second regions 112 of the silicon device layer 102 having the increased epitaxy thickness T_Si_epi, a current leakage path may arise under the field oxide region 118 if the field oxide region 118 does not extend down to the buried oxide layer 106, as indicated by the dashed arrow in FIG. 1D.

FIGS. 2A through 2D illustrate cross-sectional views of part of the SOI wafer 100 during different stages of the SOI process, according to another embodiment. The embodiment shown in FIGS. 2A through 2D is similar to the embodiment shown in FIGS. 1A through 1D. Accordingly, only the differences between the two embodiments are described here. As explained above, a current leakage path may arise under a field oxide region 118 formed in a second region 112 of the silicon device layer 102 with the increased epitaxy thickness T_Si_epi. The leakage path may be prevented by covering, during the selective epitaxy growth process, each region of the SOI wafer 100 in which a field oxide structure 118 is to be formed after the selective epitaxy growth process.

Figure 2A:
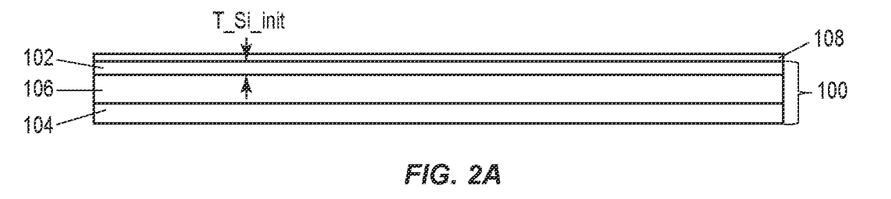
FIGS. 2A through 2D illustrate cross-sectional views of part of an SOI wafer during different stages of an SOI process, according to an embodiment.
Figure 2B:
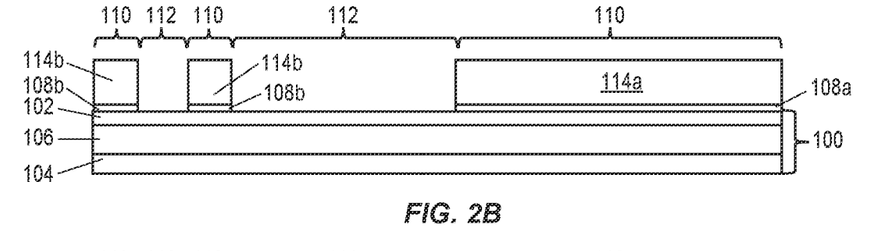
Figure 2C:
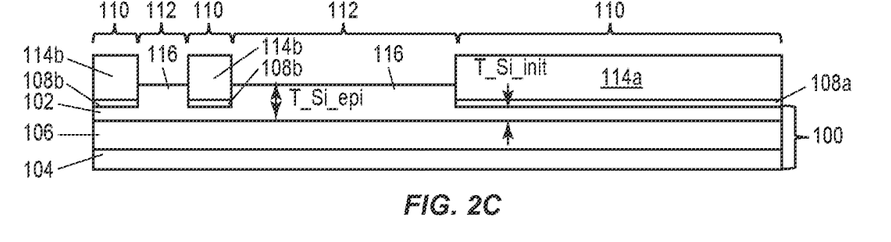
Figure 2D:
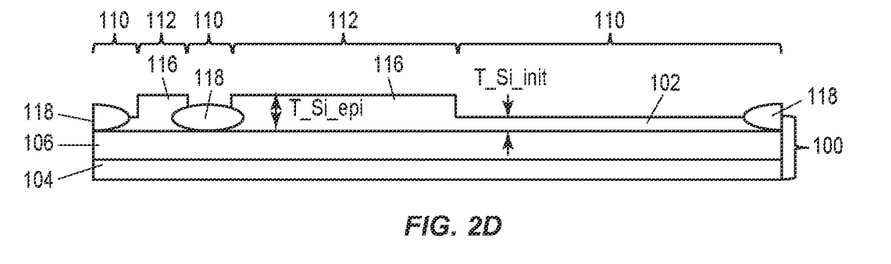

In FIG. 2B, some of the one or more first regions 110 of the silicon device layer 102 covered by the hard mask 108 during the selectively growing of the epitaxial silicon 116 correspond to field oxide regions of lateral power semiconductor devices to be produced from the SOI wafer 100. In FIGS. 2B-2C, the part of the hard mask 108 and patterned resist 114 that cover an area of the SOI wafer 100 that corresponds to field oxide regions to be formed after the selective epitaxy growth process are labelled 108b and 114b, respectively. This is in addition to the hard mask and patterned resist structures shown in FIGS. 1B-1C and which are labelled 108a and 114a, respectively, in FIGS. 2B-2C. FIG. 2D shows the SOI wafer 100 after the field oxide structure 118 are formed. The field oxide regions 118, which are formed in the one or more first regions 110 of the silicon device layer 102 covered by the hard mask 108 during the selective epitaxy growth process, extend down to the buried oxide layer 106 to prevent the leakage path described above.

Some of the one or more first regions 110 of the silicon device layer 102 covered by the hard mask 108 during the selective epitaxy growth process may correspond to contact regions of power semiconductor devices to be formed in the silicon device layer 102 and/or to additional semiconductor devices having a lower breakdown voltage than the power semiconductor devices to be formed in the silicon device layer 102, as explained above. Various embodiments of the one or more first regions 110 of the silicon device layer 102 covered by the hard mask 108 during the selective epitaxy growth process are described next.

Figure 3:
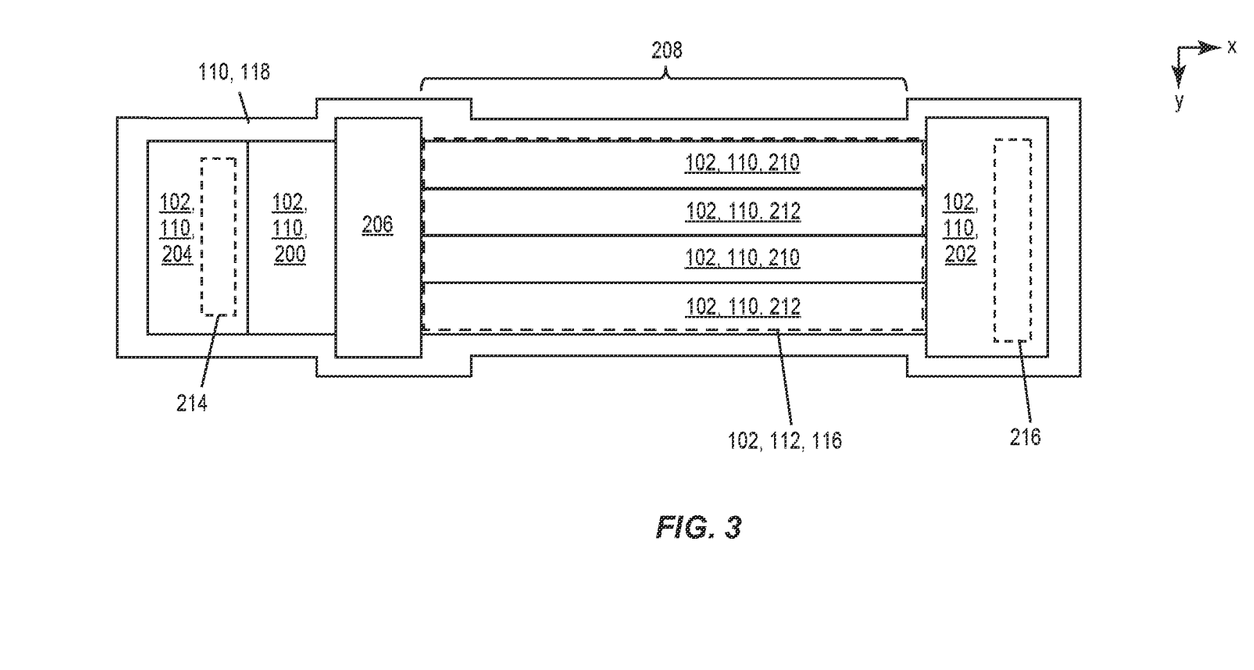
FIG. 3 illustrates a plan view of an embodiment of a lateral power MOSFET or JFET produced from the SOI wafer processed in accordance with FIGS. 1A through 1D or FIGS. 2A through 2D.

FIG. 3 illustrates a plan view of a lateral power MOSFET or JFET produced from the SOI wafer 100. The lateral power MOSFET or JFET is included in a die singulated from the SOI wafer 100. The power MOSFET or JFET is a 'lateral' device in that the primary current flow path is along the front main surface of the silicon device layer 102 in the x direction, from the source 200 to the drain 202. The source and drain 200, 202 are of a first conductivity type. The body region of a lateral power MOSFET, which would be below the source region 200 and out of view in FIG. 3, is of a second conductivity type opposite the first conductivity type. A body contact region 204 of the second conductivity type and having a higher doping concentration than the body region provides an ohmic connection to the overlying source metallization (not shown in FIG. 3). The first conductivity is n-type and the second conductivity type is p-type for an n-channel device, whereas the first conductivity is p-type and the second conductivity type is n-type for a p-channel device.

A gate electrode 206 controls the conductive state of the device channel. In the case of a MOSFET, the gate electrode 206 is insulated from the silicon device layer 102. In the case of a JFET, the gate electrode 206 contacts the silicon device layer 102. The source region 200 is illustrated in a simplified manner in FIG. 3 but may be implemented as a plurality of islands. For a p-channel JFET, the source islands are p+ regions and the gate electrode 206 contacts n+ regions to pinch off the p-channel between two (2) neighboring source islands and thus control the on/off state of the JFET.

A drift zone 208 laterally extends between the gate electrode 206 and the drain region 202 of the lateral power MOSFET or JFET. The drift zone 208 may include a superjunction structure with oppositely doped first and second regions 210, 212, where the superjunction structure enables high blocking capability (e.g., >600V) without adversely affecting Rdson. The oppositely doped regions 210, 212 of the superjunction structure may be 'stripe-shaped' in that the oppositely doped superjunction regions 210, 212 have a longest linear dimension in the x direction in FIG. 3 and parallel to the front surface of the silicon device layer 102. Four (4) superjunction stripes (2 of each conductivity type) are shown in FIG. 3. However, the device may include more superjunction stripes.

As indicated by the dashed rectangle in FIG. 3, the one or more second regions 112 of the silicon device layer 102 exposed by the hard mask 108 during the selective epitaxy growth process in FIGS. 1C and 2C correspond to the drift zone 208 of the lateral power MOSFET or JFET. Accordingly, the drift zone 208 of the lateral power MOSFET or JFET is thicker than the source, drain, body, and body contact regions 200, 202, 204 of the device. In the case of a superjunction device, this means that at least part of the oppositely doped first and second regions 210, 212 of the superjunction structure formed in the drift zone 208 may be thicker than other regions of the lateral power MOSFET or JFET to reduce Rdson.

For example, the source, drain, body, and body contact regions 200, 202, 204 of the lateral power MOSFET or JFET may not benefit from an increased epitaxy thickness and therefore may correspond to the one or more first regions 110 of the silicon device layer 102 covered by the hard mask 108 during the selective epitaxy growth process in FIGS. 1C and 2C. As explained above, field oxide regions 118 used for isolation purposes may correspond to the one or more first regions 110 of the silicon device layer 102 covered by the hard mask 108 during the selective epitaxy growth process, e.g., as shown in FIG. 2C, and therefore may extend down to the buried oxide layer 106 to prevent the leakage path described above.

In FIG. 3, the drift zone 208 of the device is devoid of contact regions. In this example, and during the selective epitaxy growth process shown in FIGS. 1C and 2C, the one or more second regions 112 of the silicon device layer 102 uncovered by the hard mask 108 expose the entirety of the drift zone area 208 between the source contact region 214 and the drain contact region 216 during the selectively growing of the epitaxial silicon 116 shown in FIGS. 1C and 2C. The source and drain contact regions 214, 216 are illustrated as respective dashed rectangles in FIG. 3 since the contact regions 214, 216 represent a vertical connection structure to the source and drain regions 200, 202, respectively. The source contact region 214 and the drain contact region 216 may include a single large contact (e.g., tungsten) or a row of smaller spaced apart contacts.

Figure 4:
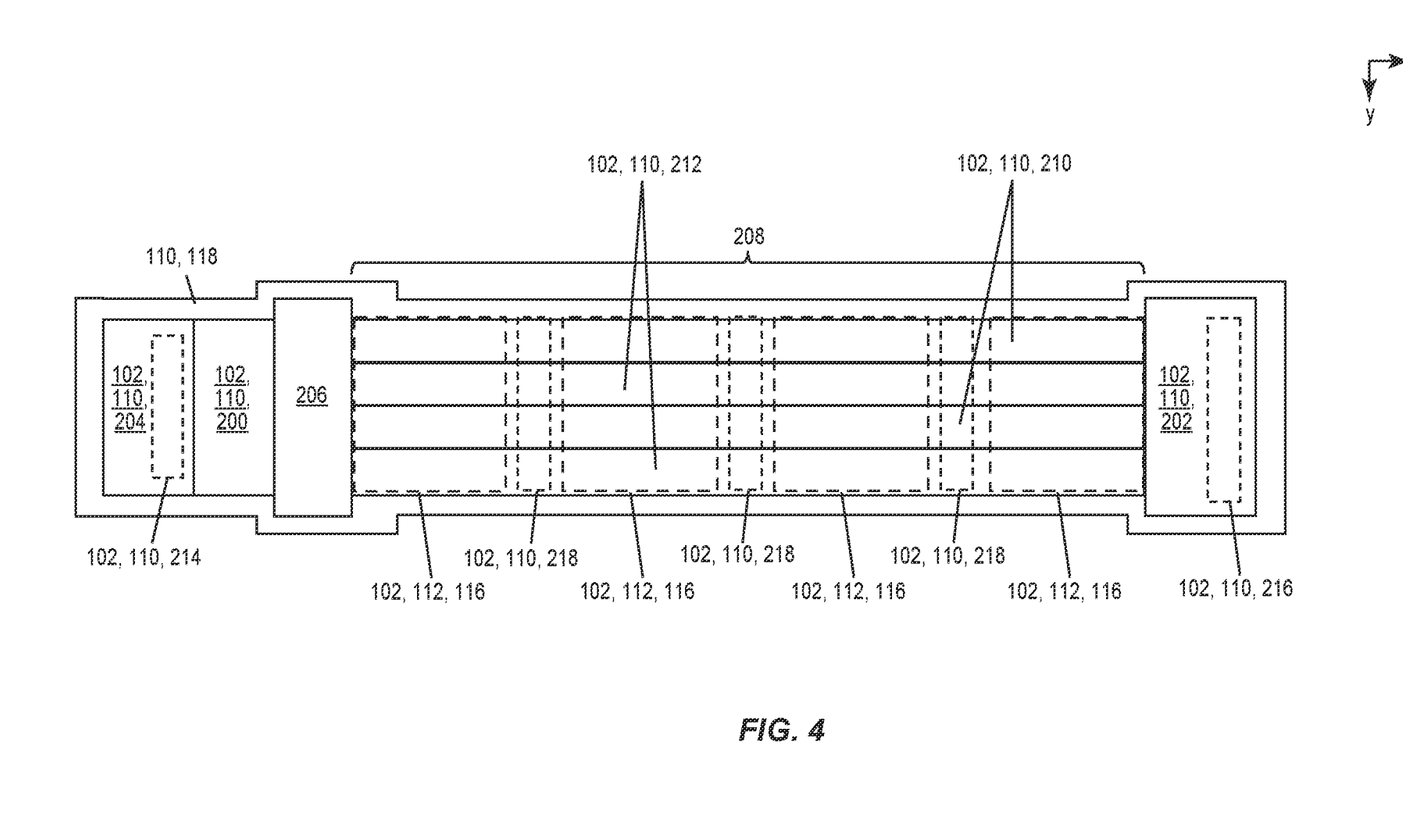
FIG. 4 illustrates a plan view of another embodiment of a lateral power MOSFET or JFET produced from the SOI wafer processed in accordance with FIGS. 1A through 1D or FIGS. 2A through 2D.

FIG. 4 illustrates a plan view of another embodiment of a lateral power MOSFET or JFET produced from the SOI wafer 100. In FIG. 4, the drift zone 208 has contact regions 218 that are laterally spaced apart from one another along a length (x direction in FIG. 4) of the drift zone 208. The drift zone contact regions 218 are illustrated as respective dashed rectangles in FIG. 4 since the drift zone contact regions 218 represent a vertical connection structure to the doped regions 212 of the superjunction structure having the second conductivity type. Each drift zone contact region 218 may include one or more contacts (e.g., tungsten) for each doped region 212 of the superjunction structure having the second conductivity type. In FIG. 4, the drift zone 208 is made thicker between the rows of the drift zone contact regions 218 but not below the rows of the contact regions 218 during the selective epitaxy growth process shown in FIGS. 1C and 2C. In this embodiment, each of the source contact regions 214, the drain contact regions 216, and the drift zone contact regions 218 have a thickness T_Si_init that remains unchanged by the selective epitaxy growth process shown in FIGS. 1C and 2C and correspond to the one or more first regions 110 of the silicon device layer 102 covered by the hard mask 108 during the selective epitaxy growth process.

Figure 5:
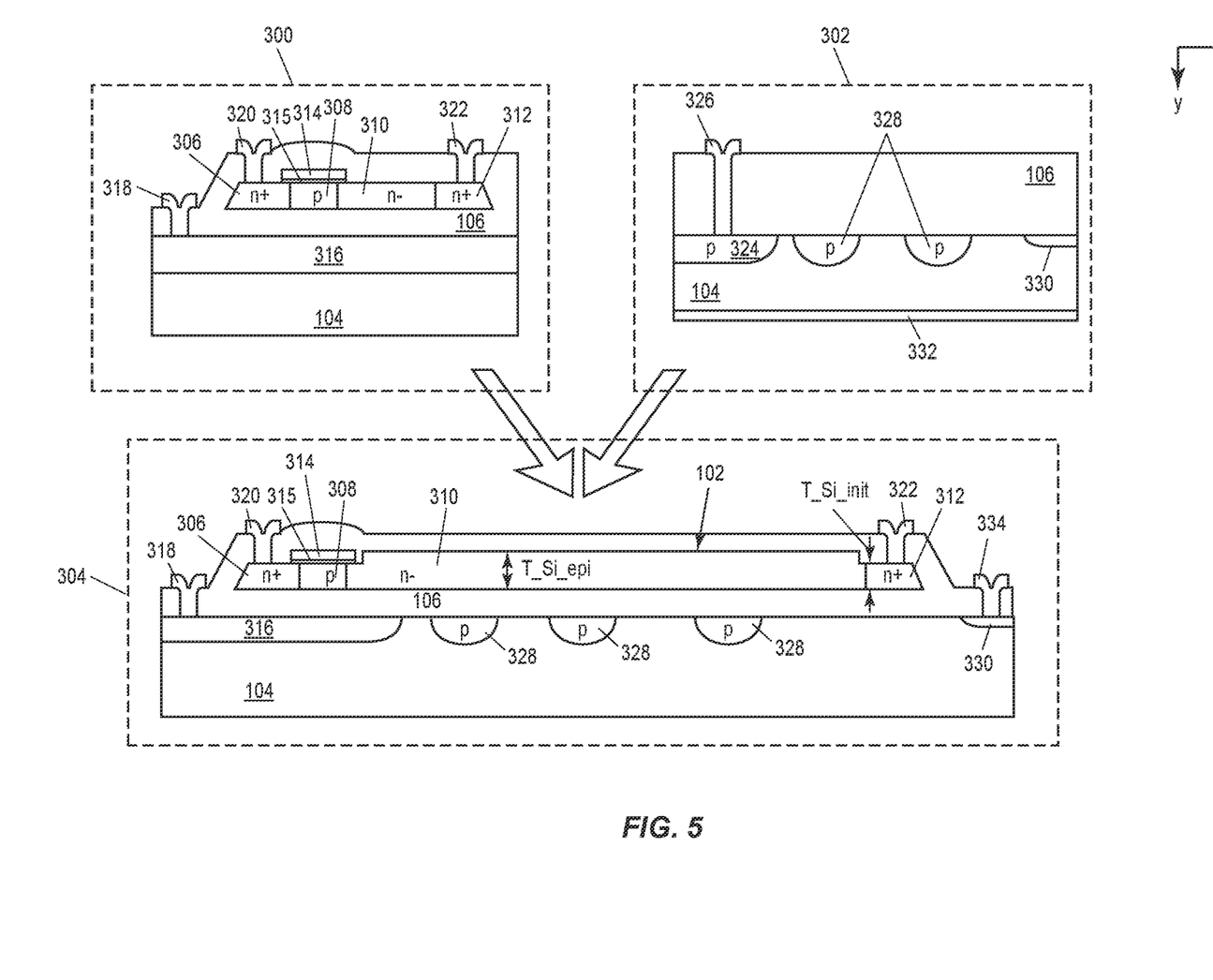
FIG. 5 illustrates cross-sectional views of an embodiment of monolithically integrating a low-voltage lateral SOI MOS transistor and a high-voltage diode in the same semiconductor die using the SOI process shown in FIGS. 1A through 1D or FIGS. 2A through 2D.

FIG. 5 illustrates cross-sectional views of a low-voltage (e.g., <600V) lateral SOI MOS transistor 300 and a high-voltage (e.g., >600V) diode 302 that are monolithically integrated together in the same semiconductor die 304 using the SOI process described herein. In the case of an n-channel device, the low-voltage lateral SOI MOS transistor 300 has an n+ source 306, a p body 308, an n− drift zone 310, and an n+ drain 312 formed in the silicon device layer 102. A gate electrode 314 insulated from the p body 308 by a gate dielectric 315 controls the channel in the p body region 308. A p-type shield well 316 is formed in the bulk silicon substrate 104 and is electrically contacted by a contact 318 that extends through the buried oxide layer 106. A source contact 320 similarly electrically contacts the n+ source region 306 and a drain contact 322 similarly electrically contacts the n+ drain region 312.

The high-voltage diode 302 includes a p anode region 324 formed in the bulk silicon substrate 104 and that is electrically contacted by a contact 326 that extends through the buried oxide layer 106. P-type shielding rings 328 and an n-type edge termination doping region 330 also may be formed in the bulk silicon substrate 104. The n+ cathode region 332 is formed at the backside of the bulk silicon substrate 104.

The monolithically integrated semiconductor die 304 includes both the low-voltage lateral SOI MOS transistor 300 and the high-voltage diode 302 formed in the same silicon device layer 102. The n− drift zone 310 of the low-voltage lateral SOI MOS transistor 300 may be lengthened (x direction in FIG. 5) and thickened (z direction in FIG. 5) to accommodate a higher blocking voltage capability. The n− drift zone 310 may be made thicker (T_Si_epi) by unmasking the corresponding region of the silicon device layer 102 during the selective epitaxy growth process shown in FIGS. 1C and 2C. The thickness (T_Si_init) of other regions of the silicon device layer 102 may remain unchanged during the selective epitaxy growth process shown in FIGS. 1C and 2C, by masking these regions of the silicon device layer 102 during the selective epitaxy growth process. For example, the regions of the silicon device layer 102 that correspond to the source, drain, gate, and contact regions 306, 312, 314, 318, 320, 322, 334 of the monolithically integrated device may be masked during the selective epitaxy growth process shown in FIGS. 1C and 2C.

Figure 6:
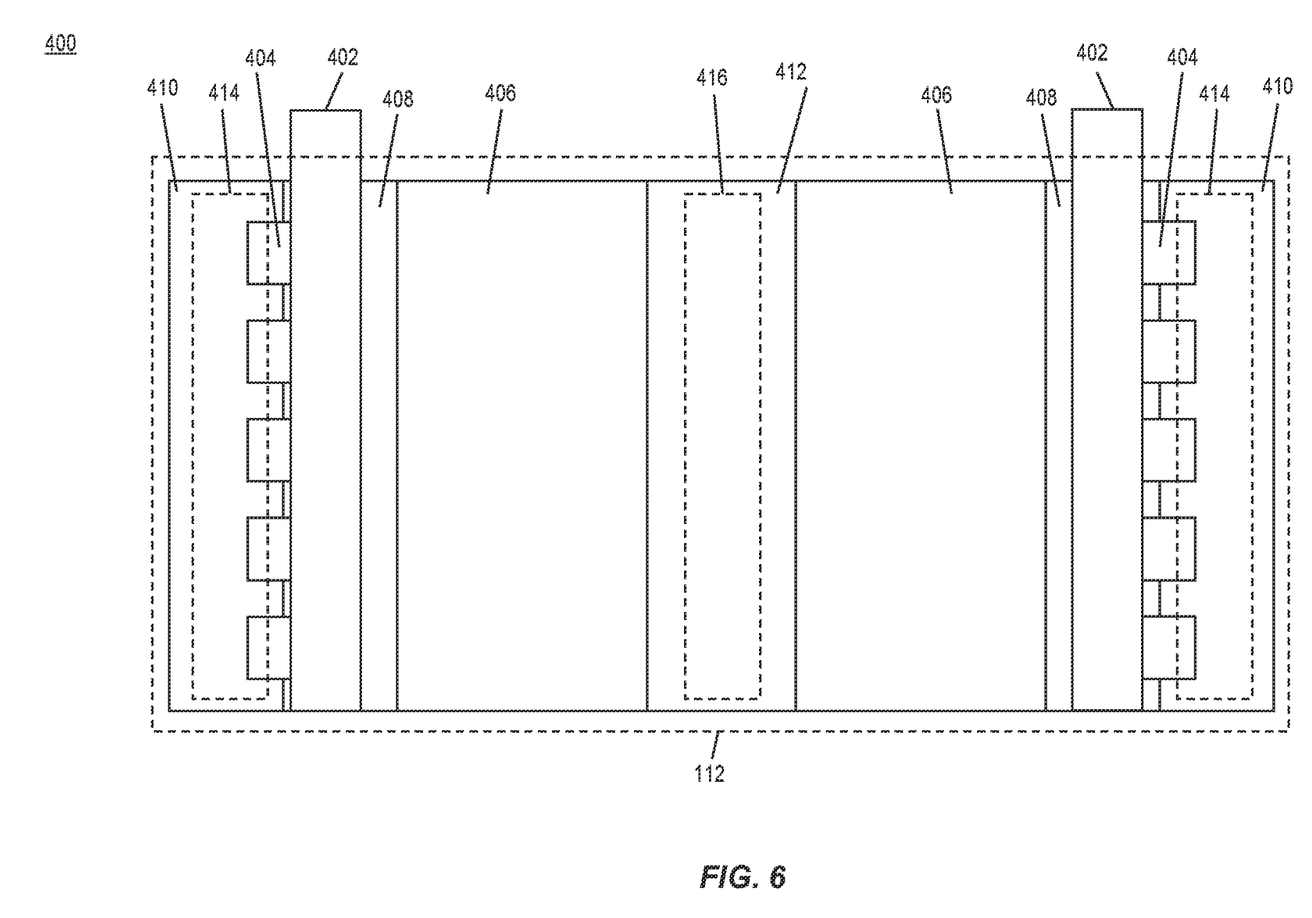
FIG. 6 illustrates a plan view of an embodiment of a power transistor device included in a semiconductor die produced using the SOI process shown in FIGS. 1A through 1D or FIGS. 2A through 2D.

FIG. 6 illustrates a plan view of an embodiment of a power transistor device 400 included in a semiconductor die produced using the SOI process described herein. Two (2) gate fingers 402 are shown in FIG. 6, but the power transistor device 400 may include more than two gate fingers 402. Each gate finger 402 controls a conduction channel between a group of source islands 404 of the first conductivity type and a drift zone 406 of the first conductivity type, through a corresponding body region 408 of the second conductivity type. A body contact region 410 of the second conductivity type and having a higher doping concentration than the body region provides an ohmic connection to the overlying source metallization (not shown in FIG. 3). The drift zones 406 extend to a drain region 412 of the first conductivity type. Source/body and drain contact regions 414, 416 are illustrated as respective dashed rectangles in FIG. 6 since the contact regions 414, 416 represent a vertical connection structure to the source/body and drain regions 404/408, 412, respectively, of the power transistor device 400.

For the power transistor device 400 shown in FIG. 6 and other transistor devices with a similar layout, the entire active area may be uncovered by the hard mask 108 during the selective epitaxy growth process shown in FIGS. 1C and 2C, since a thin (T_Si_init) SOI area is not required for any region of the device. The large rectangle surrounding the active area in FIG. 6 corresponds to a second region 112 of the silicon device layer 102 that is uncovered by the hard mask 108 during the selectively growing of the epitaxial silicon 116 shown in FIGS. 1C and 2C. Accordingly, the thickness of the entire active area of the power transistor device 400 is increased from T_Si_init to T_Si_epi by the selective epitaxy growth process shown in FIGS. 1C and 2C. The one or more first regions 110 of the silicon device layer 102 protected by the hard mask 108 during the selective epitaxy growth process shown in FIGS. 1C and 2C may correspond to an additional device (not shown) monolithically integrated with the power transistor device 400 on the same semiconductor die and having a lower breakdown voltage than the power transistor device 400.

Figure 7:
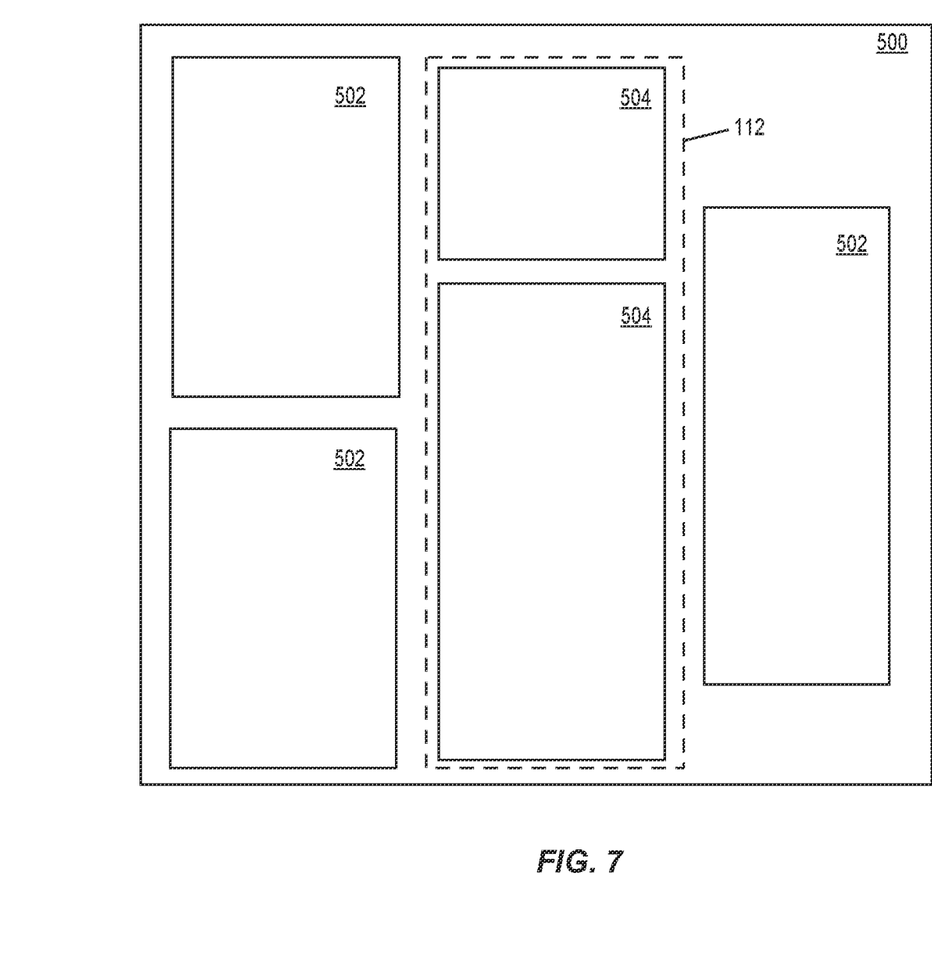
FIG. 7 illustrates a plan schematic view of an embodiment of a semiconductor die produced using the SOI process shown in FIGS. 1A through 1D or FIGS. 2A through 2D and having one or more low-voltage areas and one or more high-voltage areas.

FIG. 7 illustrates a plan schematic view of a semiconductor die 500 that includes one or more low-voltage (e.g., breakdown voltage <600V) areas 502 and one or more high-voltage (e.g., breakdown voltage >600V) areas 504. The large rectangle surrounding each high-voltage area 504 in FIG. 6 corresponds to a second region 112 of the silicon device layer 102 that is uncovered by the hard mask 108 during the selectively growing of the epitaxial silicon 116 shown in FIGS. 1C and 2C. Accordingly, the thickness of the silicon device layer 102 in the one or more high-voltage areas 504 increases from T_Si_init to T_Si_epi during the selective epitaxy growth process shown in FIGS. 1C and 2C. The thickness of the silicon device layer 102 may be increased to T_Si_epi throughout the entire active area of the one or more high-voltage areas 504, e.g., as shown in FIG. 6, or in a select region(s) such as the drift zone, e.g., as shown in FIGS. 3 and 4 where other regions like contact regions retain the initial S thickness T_Si_init.

Each low-voltage area 502 is protected by the hard mask 108 during the selective epitaxy growth process shown in FIGS. 1C and 2C and therefore retains the initial Si device layer thickness T_Si_init throughout. The high-voltage area(s) 504 may include power semiconductor devices such as a high-voltage diode, a lateral power MOSFET, a lateral JFET with a high-voltage NMOS device, etc. The low-voltage area(s) 502 may include, e.g., logic devices, low-voltage NMOS devices, driver circuitry, or other types of semiconductor devices having a lower breakdown voltage than the power semiconductor devices included in the one or more high-voltage areas 504.

Although the present disclosure is not so limited, the following numbered examples demonstrate one or more aspects of the disclosure.

Example 1. A method of producing power semiconductor devices from a silicon-on-insulator (SOI) wafer that includes a silicon device layer, a bulk silicon wafer, and a buried oxide layer separating the silicon device layer from the bulk silicon wafer, the method comprising: forming a hard mask on the silicon device layer, wherein the hard mask covers one or more first regions of the silicon device layer and exposes one or more second regions of the silicon device layer; and before forming any field oxide structures and before implanting any device regions, selectively growing epitaxial silicon on the one or more second regions of the silicon device layer exposed by the hard mask such that the thickness of the one or more second regions is increased relative to the one or more first regions.

Example 2. The method of example 1, wherein the power semiconductor devices are lateral power MOSFETs (metal-oxide-semiconductor field-effect transistors), and wherein the one or more second regions of the silicon device layer exposed by the hard mask during the selectively growing of the epitaxial silicon correspond to drift zones of the lateral power MOSFETs.

Example 3. The method of example 2, wherein the one or more first regions of the silicon device layer covered by the hard mask during the selectively growing of the epitaxial silicon correspond to contact regions of the lateral power MOSFETs.

Example 4. The method of example 3, wherein a plurality of rows of the contact regions are laterally spaced apart from one another along a length of the drift zones, and wherein during the selectively growing of the epitaxial silicon, the drift zones are made thicker between the rows of the contact regions but not below the rows of the contact regions.

Example 5. The method of example 3 or 4, wherein a first row of the contact regions are source contact regions having a thickness that remains unchanged by the selectively growing of the epitaxial silicon, and wherein a second row of the contact regions are drain contact regions having a thickness that remains unchanged by the selectively growing of the epitaxial silicon.

Example 6. The method of example 1, wherein the power semiconductor devices are lateral JFETs (junction field-effect transistors), and wherein the one or more second regions of the silicon device layer exposed by the hard mask during the selectively growing of the epitaxial silicon correspond to drift zones of the lateral JFETs.

Example 7. The method of example 6, wherein the one or more first regions of the silicon device layer covered by the hard mask during the selectively growing of the epitaxial silicon correspond to source contact regions and drain contact regions of the lateral JFETs, and wherein both the source contact regions and the drain contact regions have a thickness that remains unchanged by the selectively growing of the epitaxial silicon.

Example 8. The method of example 7, wherein the drift zones are devoid of contact regions, and wherein the one or more second regions of the silicon device layer expose an entirety of the drift zone area between the source contact regions and the drain contact regions during the selectively growing of the epitaxial silicon.

Example 9. The method of any of examples 1 through 8, wherein the one or more second regions of the silicon device layer exposed by the hard mask during the selectively growing of the epitaxial silicon correspond to drift zones of the power semiconductor devices, and wherein the one or more first regions of the silicon device layer covered by the hard mask during the selectively growing of the epitaxial silicon correspond to additional semiconductor devices having a lower breakdown voltage than the power semiconductor devices.

Example 10. The method of any of examples 1 through 9, wherein the one or more first regions of the silicon device layer covered by the hard mask during the selectively growing of the epitaxial silicon correspond to field oxide regions of the power semiconductor devices.

Example 11. The method of any of examples 1 through 10, wherein the one or more first regions of the silicon device layer covered by the hard mask during the selectively growing of the epitaxial silicon correspond to contact regions of the power semiconductor devices.

Example 12. The method of any of examples 1 through 11, wherein the power semiconductor devices are PMOS devices having a breakdown voltage greater than 600V, and wherein the one or more first regions of the silicon device layer covered by the hard mask during the selectively growing of the epitaxial silicon correspond to additional semiconductor devices having a breakdown voltage less than 600V.

Example 13. The method of any of examples 1 through 12, wherein before the selectively growing of the epitaxial silicon, the silicon device layer has a single thickness in a range of 100 to 200 nm.

Example 14. The method of any of examples 1 through 13, wherein the hard mask comprises tetraethoxysilane formed by low-pressure chemical vapor deposition.

Example 15. A semiconductor die, comprising: a silicon-on-insulator (SOI) substrate that includes a silicon device layer, a bulk silicon substrate, and a buried oxide layer separating the silicon device layer from the bulk silicon substrate; a lateral power MOSFET (metal-oxide-semiconductor field-effect transistor) formed in a first device region of the silicon device layer; and an additional semiconductor device formed in a second device region of the silicon device layer and having a lower breakdown voltage than the lateral power MOSFET, wherein the silicon device layer has a first thickness in a first part of the first device region and a second thickness in a second part of the first device region, the second thickness being greater than the first thickness, wherein the silicon device layer has the first thickness throughout the second device region.

Example 16. The semiconductor die of example 15, wherein the second part of the first device region includes a drift zone of the lateral power MOSFET, and wherein the first part of the first device region includes contact regions of the lateral power MOSFET.

Example 17. The semiconductor die of example 16, wherein the contact regions are arranged in rows that are laterally spaced apart from one another along a length of the drift zone such that the drift zone is thicker between the rows of the contact regions and thinner below the rows of the contact regions.

Example 18. The semiconductor die of example 16 or 17, wherein a first row of the contact regions are source contact regions of the lateral power MOSFET and a second row of the contact regions are drain contact regions of the lateral power MOSFET, and wherein the drift zone is devoid of the contact regions such that the drift zone has the second thickness along an entirety of the drift zone area between the source contact regions and the drain contact regions.

Example 19. The semiconductor die of example 15, wherein the second part of the first device region includes a drift zone of the lateral power MOSFET, and wherein the first part of the first device region includes field oxide regions.

Example 20. A semiconductor die, comprising: a silicon-on-insulator (SOI) substrate that includes a silicon device layer, a bulk silicon substrate, and a buried oxide layer separating the silicon device layer from the bulk silicon substrate; and a lateral JFET (junction field-effect transistor) formed in the silicon device layer, wherein a first part of the silicon device layer has a first thickness and a second part of the silicon device layer has a second thickness greater than the first thickness, wherein, in the silicon device layer, the lateral JFET comprises a source region, a drain region, a drift zone adjoining the drain region, and a body region separating the source region from the drift zone, wherein the drift zone is formed in the second part of the silicon device layer.

Example 21. The semiconductor die of example 20, wherein contact regions of the lateral JFET are formed in the first part of the silicon device layer.

Example 22. The semiconductor die of example 21, wherein a first row of the contact regions are source contact regions of the lateral JFET and a second row of the contact regions are drain contact regions of the lateral JFET, and wherein the drift zone is devoid of the contact regions such that the drift zone has the second thickness along an entirety of the drift zone area between the source contact regions and the drain contact regions.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of producing power semiconductor devices from a silicon-on-insulator (SOI) wafer that includes a silicon device layer, a bulk silicon wafer, and a buried oxide layer separating the silicon device layer from the bulk silicon wafer, the method comprising:
    forming a hard mask on the silicon device layer, wherein the hard mask covers one or more first regions of the silicon device layer and exposes one or more second regions of the silicon device layer; and
    before forming any field oxide structures and before implanting any device regions, selectively growing epitaxial silicon on the one or more second regions of the silicon device layer exposed by the hard mask such that the thickness of the one or more second regions is increased relative to the one or more first regions.

2. The method of claim 1, wherein the power semiconductor devices are lateral power MOSFETs (metal-oxide-semiconductor field-effect transistors), and wherein the one or more second regions of the silicon device layer exposed by the hard mask during the selectively growing of the epitaxial silicon correspond to drift zones of the lateral power MOSFETs.

3. The method of claim 2, wherein the one or more first regions of the silicon device layer covered by the hard mask during the selectively growing of the epitaxial silicon correspond to contact regions of the lateral power MOSFETs.

4. The method of claim 3, wherein a plurality of rows of the contact regions are laterally spaced apart from one another along a length of the drift zones, and wherein during the selectively growing of the epitaxial silicon, the drift zones are made thicker between the rows of the contact regions but not below the rows of the contact regions.

5. The method of claim 3, wherein a first row of the contact regions are source contact regions having a thickness that remains unchanged by the selectively growing of the epitaxial silicon, and wherein a second row of the contact regions are drain contact regions having a thickness that remains unchanged by the selectively growing of the epitaxial silicon.

6. The method of claim 1, wherein the power semiconductor devices are lateral JFETs (junction field-effect transistors), and wherein the one or more second regions of the silicon device layer exposed by the hard mask during the selectively growing of the epitaxial silicon correspond to drift zones of the lateral JFETs.

7. The method of claim 6, wherein the one or more first regions of the silicon device layer covered by the hard mask during the selectively growing of the epitaxial silicon correspond to source contact regions and drain contact regions of the lateral JFETs, and wherein both the source contact regions and the drain contact regions have a thickness that remains unchanged by the selectively growing of the epitaxial silicon.

8. The method of claim 7, wherein the drift zones are devoid of contact regions, and wherein the one or more second regions of the silicon device layer expose an entirety of the drift zone area between the source contact regions and the drain contact regions during the selectively growing of the epitaxial silicon.

9. The method of claim 1, wherein the one or more second regions of the silicon device layer exposed by the hard mask during the selectively growing of the epitaxial silicon correspond to drift zones of the power semiconductor devices, and wherein the one or more first regions of the silicon device layer covered by the hard mask during the selectively growing of the epitaxial silicon correspond to additional semiconductor devices having a lower breakdown voltage than the power semiconductor devices.

10. The method of claim 1, wherein the one or more first regions of the silicon device layer covered by the hard mask during the selectively growing of the epitaxial silicon correspond to field oxide regions of the power semiconductor devices.

11. The method of claim 1, wherein the one or more first regions of the silicon device layer covered by the hard mask during the selectively growing of the epitaxial silicon correspond to contact regions of the power semiconductor devices.

12. The method of claim 1, wherein the power semiconductor devices are PMOS devices having a breakdown voltage greater than 600V, and wherein the one or more first regions of the silicon device layer covered by the hard mask during the selectively growing of the epitaxial silicon correspond to additional semiconductor devices having a breakdown voltage less than 600V.

13. The method of claim 1, wherein before the selectively growing of the epitaxial silicon, the silicon device layer has a single thickness in a range of 100 to 200 nm.

14. The method of claim 1, wherein the hard mask comprises tetraethoxysilane formed by low-pressure chemical vapor deposition.

* * * * *